(12) United States Patent
Sun

(10) Patent No.: US 6,933,162 B2
(45) Date of Patent: Aug. 23, 2005

(54) METHOD FOR FABRICATING A LIQUID CRYSTAL DISPLAY

(75) Inventor: Wein-Town Sun, Kaohsiung (TW)

(73) Assignee: AU Optronics Corp., Hsinchu (TW)

(*) Notice: Subject to any disclaimer, the term of this patent is extended or adjusted under 35 U.S.C. 154(b) by 5 days.

(21) Appl. No.: 10/792,105

(22) Filed: Mar. 3, 2004

(65) Prior Publication Data

US 2005/0108676 A1    May 19, 2005

(30) Foreign Application Priority Data

Nov. 17, 2003  (TW) .............................. 92132101 A

(51) Int. Cl.[7] .......................................... H01L 21/00
(52) U.S. Cl. ..................................................... 438/30
(58) Field of Search .............................. 438/22, 29, 30; 430/311, 312

(56) References Cited

U.S. PATENT DOCUMENTS

| | | | |
|---|---|---|---|
| 5,656,526 A | 8/1997 | Inada et al. ................. 430/314 |
| 5,795,686 A | 8/1998 | Takizawa et al. ............... 430/5 |
| 5,945,256 A | 8/1999 | Kim et al. .................... 430/312 |
| 6,157,433 A | 12/2000 | Kashimoto et al. ......... 349/187 |
| 6,773,996 B2 * | 8/2004 | Suzawa et al. ............. 438/279 |

* cited by examiner

*Primary Examiner*—Michael Lebentritt
*Assistant Examiner*—Scott B. Geyer
(74) *Attorney, Agent, or Firm*—Thomas, Kayden, Horstemeyer & Risley

(57) ABSTRACT

A method of fabricating a liquid crystal display (LCD). The gate electrodes or the source/drain electrode pairs of thin film transistors in the LCD are patterned by at least a first mask and a second mask. The gate electrodes or the source/drain electrode pairs at the boundary region defined by both the first and second masks are divided into a first portion patterned by the first mask and a second portion patterned by the second mask. The boundary region is divided incrementally or by square wave such that the area of each of the gate electrodes or the source/drain electrode pairs in the first portion increases along the boundary direction and in the second portion decreases along the boundary direction.

15 Claims, 7 Drawing Sheets

METHOD FOR FABRICATING A LIQUID CRYSTAL DISPLAY

BACKGROUND OF THE INVENTION

1. Field of the Invention

The present invention relates in general to a method for fabricating a liquid crystal display (LCD), and specifically to a method comprising a boundary region being divided into a first mask and a second mask to suppress shot mura.

2. Description of the Related Art

FIG. 1 illustrates the circuit diagram of the pixel in a conventional thin film transistor liquid crystal display (abbreviated as TFT-LCD in the following description). As shown in FIG. 1, the circuits comprise a common electrode COM, a data line DL, a scan line GL, a thin film transistor Tx, a storage capacitor Cst, and a liquid crystal cell Clc. The data line DL is coupled to the source terminal S of the thin film transistor Tx. The scan line GL is coupled to the gate terminal G of the thin film transistor Tx. One terminal of the storage capacitor Cst is coupled to the drain terminal D of the thin film transistor Tx, while the other terminal of the storage capacitor Cst is coupled to the common electrode COM or the gate line of the adjacent pixel depending on the application. One terminal of the liquid crystal cell Clc is coupled to the drain terminal D of the thin film transistor Tx, while the other terminal of the liquid crystal cell Clc is coupled to the common electrode COM. In addition, there is a parasitic capacitor Cgd between the gate terminal G and the drain terminal D of the thin film transistor.

FIG. 2 illustrates the plane view of the conventional active matrix type TFT-LCD configuration. The TFT-LCD shown in FIG. 2 is comprised of a plurality of pixels, shown in FIG. 1, in an array configuration.

As the screen size of the TFT-LCD increases, the pattern of the essential circuits and devices are divided into several photo masks to fabricate a TFT-LCD. As shown in FIG. 2, the regions I and II are defined by photo masks A and B, respectively, and BL is the boundary line of the photo mask A and B. As is known from FIG. 2, the gate and drain/source electrodes are formed using different masks A and B. Since there is an overlay-offset or misalignment issue, the area in which the gate overlaps the source/drain (S/D) in a thin film transistor is different in size on both sides of the boundary line BL. This makes the overlapping capacitance Cgd different, leading to the shot mura phenomenon.

FIG. 3 illustrates the layout of the pixels, shown in FIG. 2, on both sides of the boundary line BL. In FIG. 3, 30 stands for a gate line and 32 stands for a data line. In the thin film transistors, the size of the areas which the gate line 30 overlaps the drains D are $A_{gd\_A}$ and $A_{gd\_B}$, respectively, and the corresponding capacitances are $C_{gd\_A}$ and $C_{gd\_B}$. Therefore, the feedthrough voltages of the pixels on both sides of the boundary line are, $$\Delta V_{p\_A} = \frac{\Delta V_g \times C_{gd\_A}}{C_{total\_A}} \text{ and } \Delta V_{p\_B} = \frac{\Delta V_g \times C_{gd\_B}}{C_{total\_B}};$$

wherein, $C_{total\_A} \approx Cst + Clc + C_{gd\_A}$, $C_{total\_B} \approx Cst + Clc + C_{gd\_B}$; $\Delta V_g$ stands for the difference in the gate voltage when the TFT is turned on or turned off.

Assuming that $C_{total\_A} = C_{total\_B} = C_{total}$, the difference in the feedthrough voltage of the pixels on both sides of the boundary line BL is, $$\Delta V_{p\_A} - \Delta V_{p\_B} = \tag{1}$$

$$\frac{\Delta V_g \times C_{gd\_A}}{C_{total\_A}} - \frac{\Delta V_g \times C_{gd\_B}}{C_{total\_B}} = \Delta V_g \times \frac{C_{gd\_A} - C_{gd\_B}}{C_{total}};$$

According to the experimental results, if the difference in the feedthrough voltage is greater than 5 mV, the shot mura is visible with the naked eye.

In conventional methods for fabricating a TFT with A and B masks (or with more masks), such as U.S. Pat. No. 5,795,686, U.S. Pat. No. 5,656,526, U.S. Pat. No. 6,157,433, U.S. Pat. No. 5,945,256, and so on, the gate and drain/source electrodes are exposed using different masks A and B, and therefore the shot mura phenomenon inevitably occurs. If the difference in the feedthrough voltage of the pixels on both sides of the boundary line can be minimized, immunity to the shot mura phenomenon can be increased.

SUMMARY OF THE INVENTION

The object of the present invention is to provide a method for fabricating a liquid crystal display. The TFT-LCD fabricated with such method is provided with higher immunity to the shot mura phenomenon.

The main characteristics of the present invention are described in the following. The boundary region which two different masks overlap is divided into two portions incrementally or by square wave. Thus, the gate or source/drain electrodes are divided into two different exposure blocks. Therefore, the gate-drain overlapping capacitance Cgd of the TFT in the boundary region changes gradually, thereby reducing the difference in the feedthrough voltage, to suppress the shot mura phenomenon.

To achieve the above-mentioned object, the present invention provides a method for fabricating a liquid crystal display (LCD). The method comprises the steps described as follows. First, a gate pattern, including a plurality of separated gate lines and a gate electrode array electrically connected with the separated gate lines, are formed in a substrate. Subsequently, a channel array, separated from the gate electrode array, is formed. Thereafter, a source/drain pair array, with the source and drain spaced apart from each other, is formed in the channel array. Finally, a pixel electrode array is formed to connect the drains of the source/drain pair array.

It is noted that the steps for forming the gate pattern and the source/drain pair array, at least, comprise the steps of forming a photoresist layer; dividing the photoresist layer into a first region, a second region, and a boundary region, divided into a first portion and a second portion by a boundary line, between the first region and the second region; defining the first region and the first portion with a first mask; and defining the second region and the second portion with a second mask.

The boundary region corresponds to a sub-array of the gate electrode array or the source/drain pair array. For each row of the gate electrodes or each row of the source/drain pairs in the sub-array, the boundary line is formed in a special pattern. The gate electrodes or the source/drain electrode pairs at the boundary region defined by both the first and second masks are divided into a first portion patterned by the first mask and a second portion patterned by the second mask. The boundary region is divided incrementally or by square wave such that the area of each of the gate electrodes or the source/drain electrode pairs in the first portion increases along the boundary direction and in the second portion decreases along the boundary direction.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
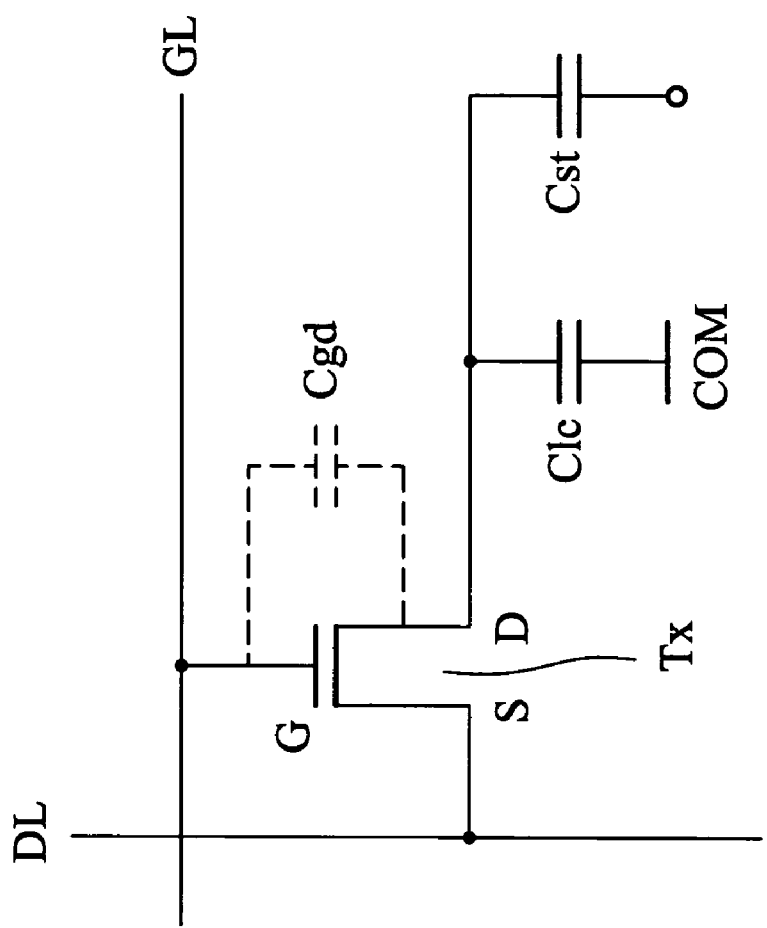
FIG. 1 is the circuit diagram of the pixel in a conventional thin film transistor liquid crystal display.
Figure 2:
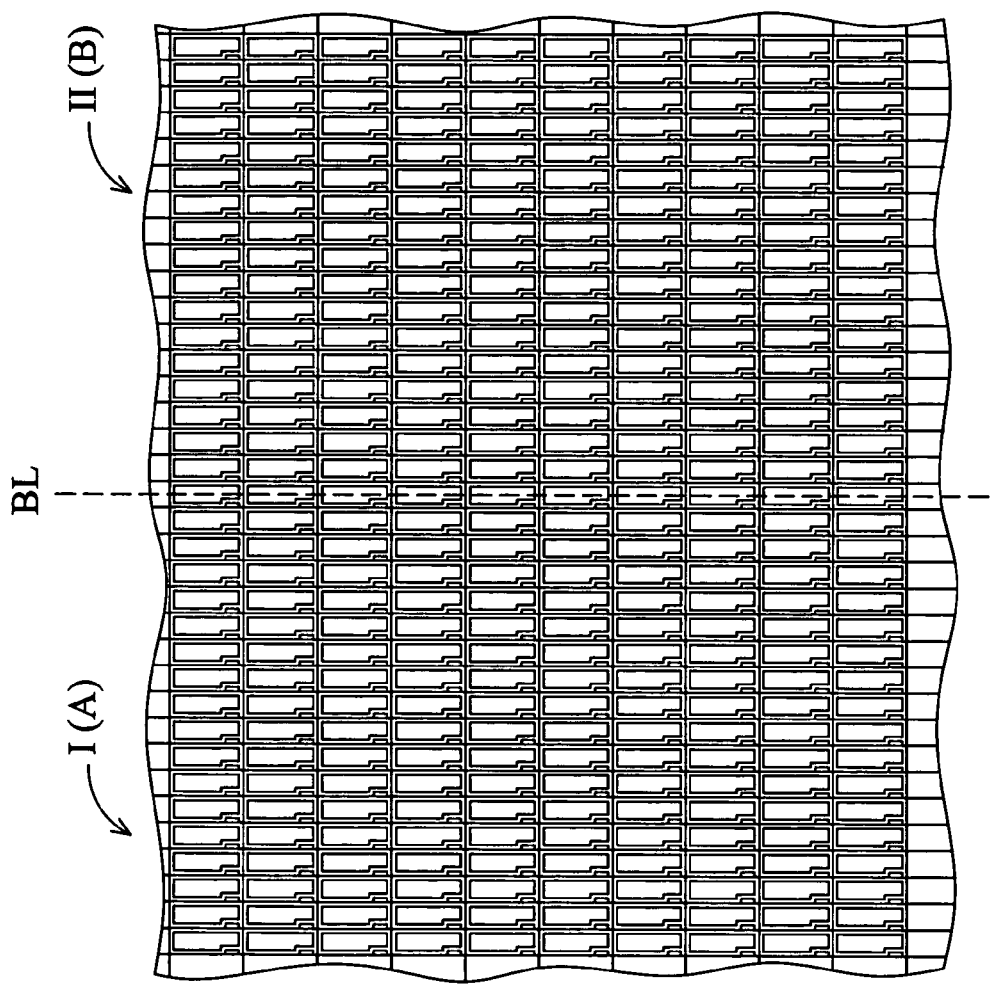
FIG. 2 is the plane view of the conventional active matrix type TFT-LCD configuration.
Figure 3:
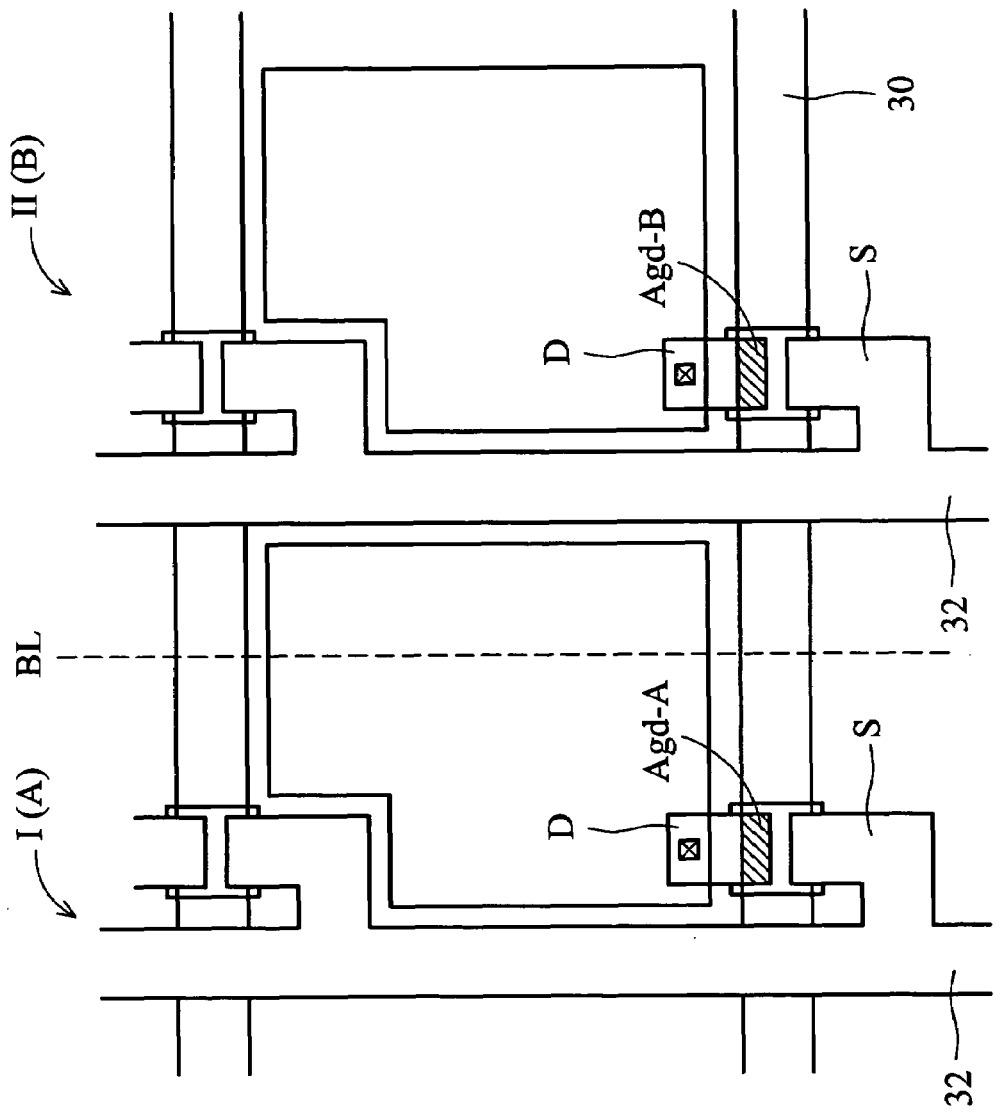
FIG. 3 is the layout of the pixels on both sides of the boundary line BL.
Figure 4:
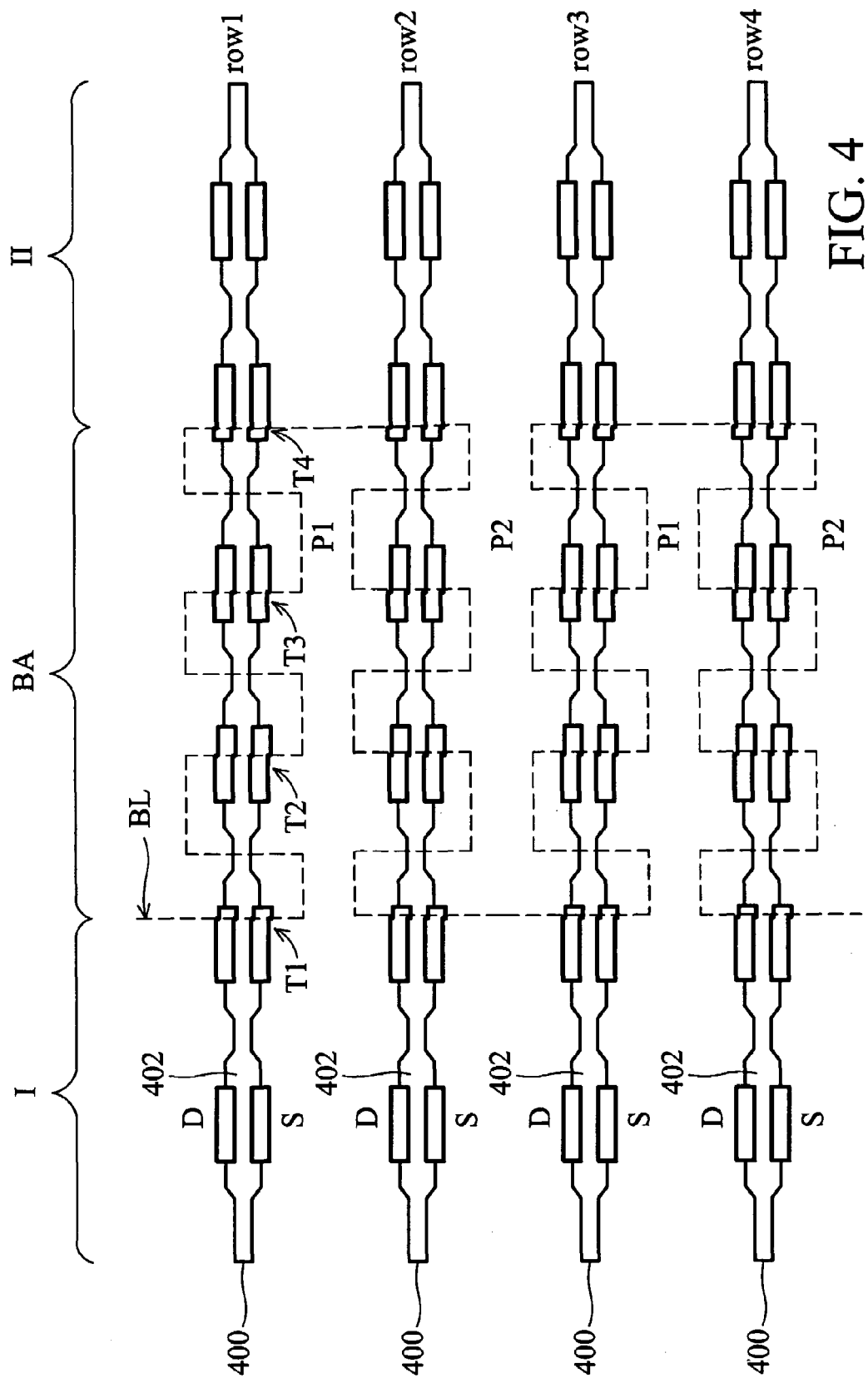
FIG. 4 is the layout of the TFT-LCD according to the embodiment of the present invention.

FIG. 4 illustrates the layout of the TFT-LCD according to the embodiment of the present invention. The amorphous silicon layer as the channel layer and the pixel electrode are not depicted for the purpose of simplicity.

The TFT-LCD shown in FIG. 4 comprises a plurality of gate lines 400 configured in parallel; a gate electrode array comprising a plurality of gate electrodes 402, each electrically connected with the gate line; and a source/drain pair array, arranged in corresponding to the gate electrode array, with the source and drain spaced apart from each other.

The TFT-LCD shown in FIG. 4 is at least divided into a first region I, a second region II, and a boundary region BA, divided into several first portions P1 and second portions P2 by a boundary line BL, between the first region I and the second region II. The first region I and the first portion P1 are defined with a first mask A. In addition, the second region II and the second portion P2 are defined with a second mask B.

In FIG. 4, the boundary line BL is formed in a square wave pattern. The boundary region is divided such that the area of the gate electrodes 402, lying in the first row of the gate electrodes row1, or the source/drain pairs, lying in the first row of the source/drain electrode pairs, in the first portion P1 decreases along the boundary direction and that in the second portion P2 increases along the boundary direction.

After the boundary line BL repetitively divides the row1 from the region I to the region II, the boundary line BL continues to repetitively divide the row2 from the region II to the region I. Under this condition, the area of the gate or source/drain electrodes in the first portion P1 defined by the first mask decreases while that in the second portion P2 defined by the second mask increases. Row 3 and row4 are divided by the boundary line BL following the division of row2.

In FIG. 4, it is assumed that there are N−1 transistors T1~TN−1 and the proportion of the area of the gate electrodes or source/drain pairs defined by the second mask B to that defined by the first mask A changes incrementally, such as 1:N−1, 2:N−2 ... k:N−k, k+1:N−(k+1) ... N−2:2, N−1:1. The gate-drain overlapping capacitance of the transistors Tk and Tk+1 are $C_{gd\_k} = (kC_{gd\_I} + (N-k)C_{gd\_II})/N$ and $C_{gd\_k+1} = ((k+1)C_{gd\_I} + (N-k-1)C_{gd\_II})/N$. According to the formula in (1), $$\Delta V_{p\_A} - \Delta V_{p\_B} = \frac{\Delta V_g \times C_{gd\_k+1}}{C_{total\_I}} - \frac{\Delta V_g \times C_{gd\_k}}{C_{total\_II}} = \Delta V_g \times \frac{C_{gd\_I} - C_{gd\_II}}{N \times C_{total}}; \quad (2)$$

from (2), it is known that the difference in the feedthrough voltage between any two adjacent pixels is 1/N of the original. That is, the capability to suppress the shot mura caused by misalignment is increased N-fold.

In this embodiment (N=5), there are 4 transistors T1~T4, the proportions of the area of the gate electrodes or source/drain pairs defined by the second mask B to that defined by the first mask A are 4:1, 3:2, 2:3, and 1:4.

Figure 5A:
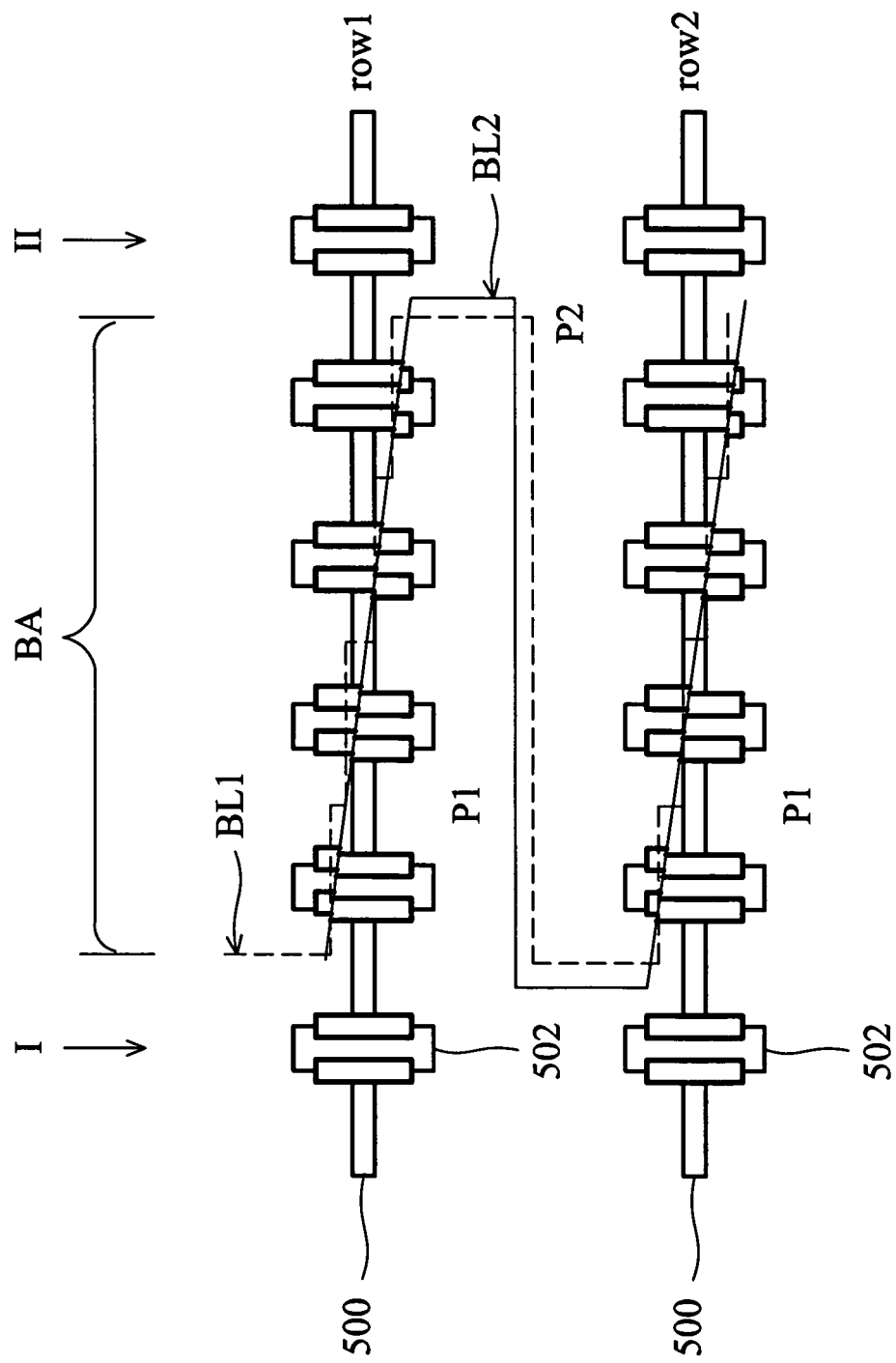
FIGS. 5A and 5B are the layout of the TFT-LCD according to another embodiment of the present invention.
Figure 5B:
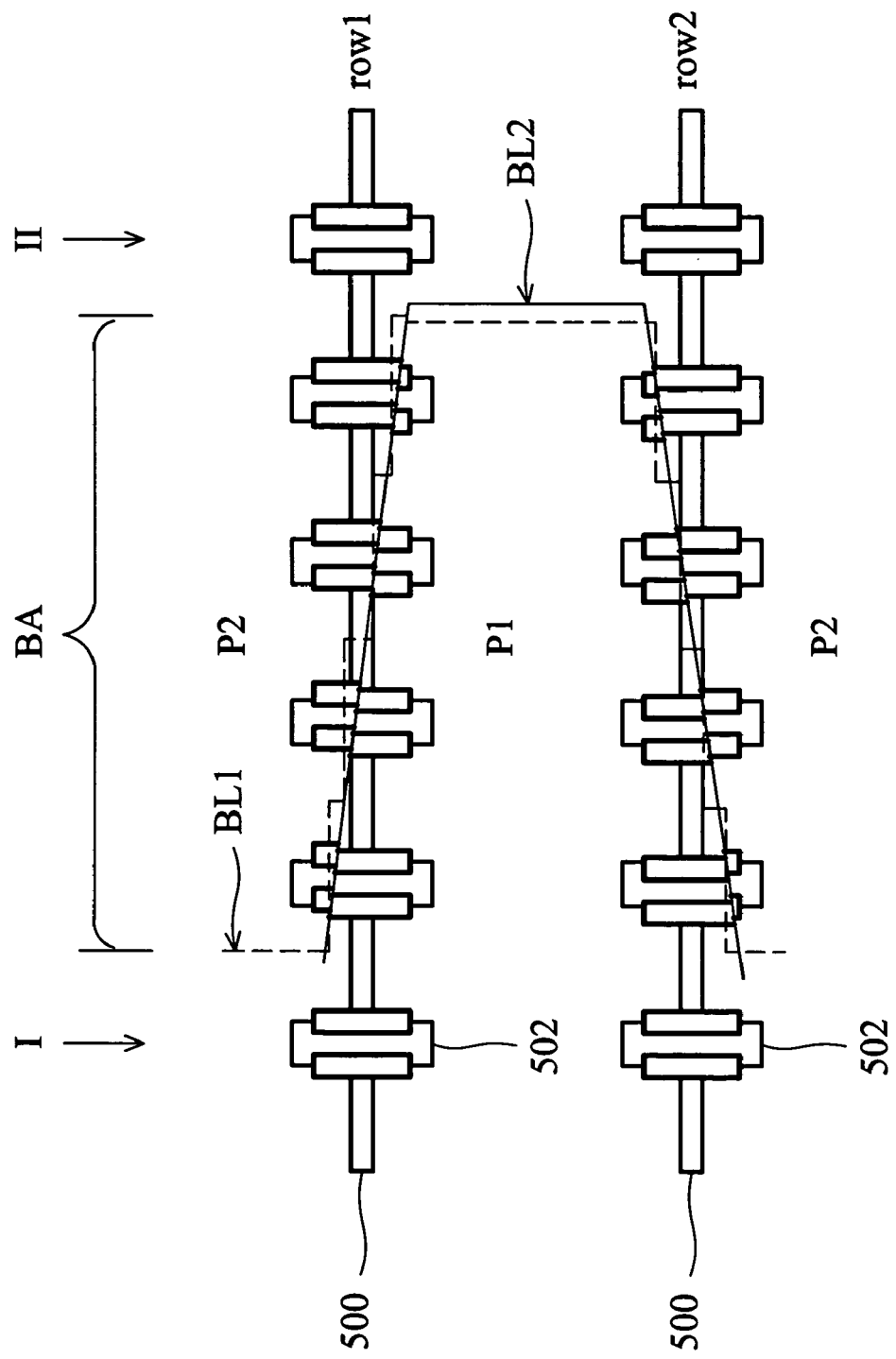

FIGS. 5A and 5B illustrate the layout of the TFT-LCD according to another embodiment of the present invention. The amorphous silicon layer as a channel layer and the pixel electrode are not depicted for the sake of simplicity.

The TFT-LCDs shown in FIGS. 5A and 5B comprise a plurality of gate lines 500 configured in parallel; a gate electrode array comprising a plurality of gate electrodes 502, each electrically connected with the gate line; and a source/drain pair array, arranged in corresponding to the gate electrode array, with the source and drain spaced apart from each other.

The TFT-LCD shown in FIGS. 5A and 5B is at least divided into a first region I, a second region II, and a boundary region BA. The boundary region BA lies between the first region I and the second region II and is divided into several first portions P1 and second portions P2 by a boundary line BL1 (the dotted line) or BL2. The first region I and the first portion P1 are defined with a first mask A. In addition, the second region II and the second portion P2 are defined with a second mask B.

In FIG. 5A, the boundary line BL1 is formed in a ladder pattern. The boundary region is divided such that the area of the gate electrodes 502, lying in the first row of the gate electrodes row1, or the source/drain pairs, lying in the first row of the source/drain electrode pairs, in the first portion P1 decreases along the boundary direction and that in the second portion P2 increases along the boundary direction.

After the boundary line BL1 repetitively divides the row1 from the region I to the region II, the boundary line BL1 goes back to the region I and continues to repetitively divide the row2 from the region I to the region II.

The FIG. 5B is different from FIG. 5A in how the rows are divided into first portions P1 and second portions P2. After the boundary line BL1(BL2) divides the row1 from the region I to the region II, the boundary line BL1 (BL2) continues to divide the row2 from the region II to the region I. Under this condition, the area of the gate or source/drain electrodes in the first portion P1 defined by the first mask decreases while that in the second portion P2 defined by the second mask increases. The other rows are sequentially divided by the boundary line BL following the division of the row2.

Figure 6:
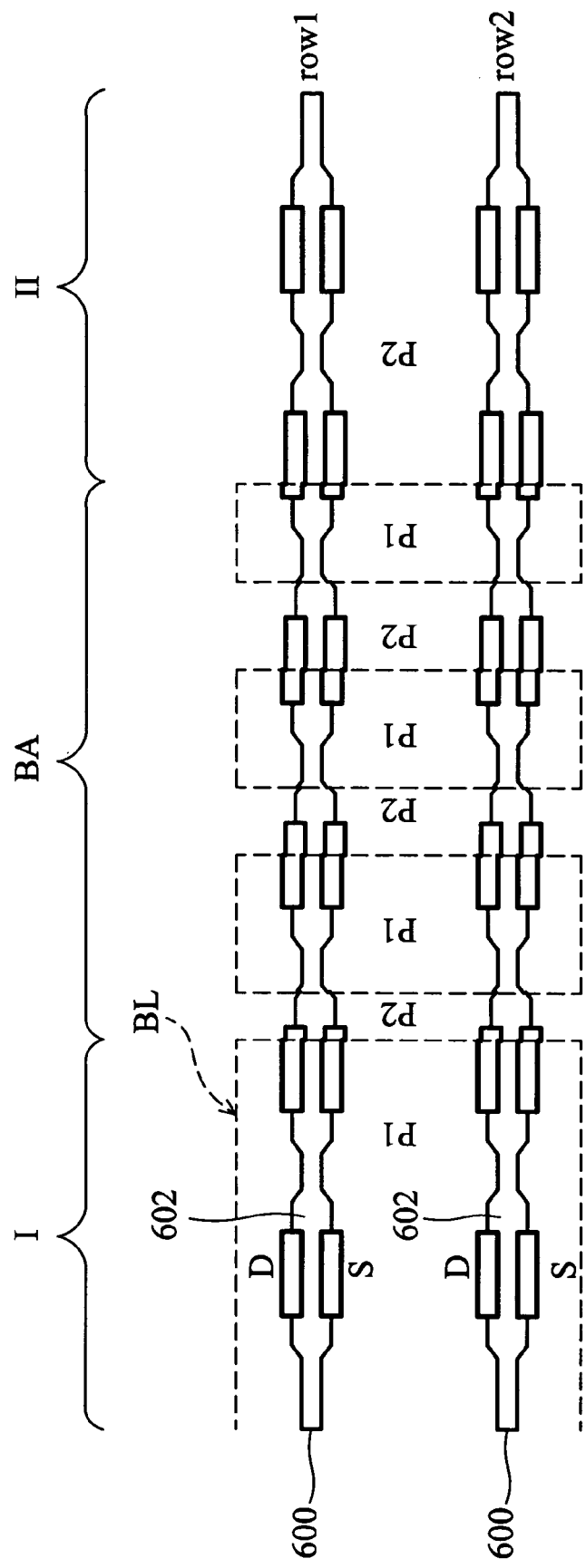
FIG. 6 is the embedded line layout of the TFT-LCD according to another embodiment of the present invention.

In the aforementioned embodiments, the gate electrodes or source/drain pairs are divided by the boundary line in a tilted straight line pattern, a ladder pattern, a square wave pattern, an embedded line pattern and so on. Referring to FIG. 6, the boundary line BL is an embedded line. The embedded line is a line which makes the first portion P1 and the second portion P2 embedded in each other.

The present invention provides a novel method for fabricating a liquid crystal display, the method comprising the steps described as follows, First, a gate pattern, including a plurality of separated gate lines and a gate electrode array electrically connected with the separated gate lines, are formed in a substrate. Subsequently, a channel array, separated from the gate electrode array, is formed. Thereafter, a source/drain pair array, with the source and drain spaced apart from each other, is formed in the channel array. Finally, a pixel electrode array is formed to connect the drains of the source/drain pair array.

The key point of the fabricating method is that the gate or source/drain patterns are divided into a first mask and a second mask by a boundary line in a special pattern, as described in the embodiments. The boundary region is divided such that the area of the gate or source/drain electrodes in the first portion P1 defined by the first mask increases (decreases) while that in the second portion P2 defined by the second mask decreases (increases).

As described in the embodiments, the TFT-LCD fabricated with such method is provided with higher immunity to the shot mura phenomenon.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for fabricating a liquid crystal display including a plurality of pixels, the method comprising the steps of:
    forming a gate pattern, including a plurality of separated gate lines and a gate electrode array electrically connected with the separated gate lines, in a substrate;
    forming a channel array, isolated from the gate electrode array;
    forming a source/drain pair array, with the source and drain spaced apart from each other, in the channel array; and
    forming a pixel electrode array to connect the drains of the source/drain pair array;
    wherein the steps for forming the gate pattern or the source/drain pair array, at least, comprise the steps of:
    forming a photoresist layer;
    dividing the photoresist layer into a first region, a second region, and a boundary region, divided into a first portion and a second portion by a boundary line, between the first region and the second region;
    defining the first region and the first portion with a first mask; and
    defining the second region and the second portion with a second mask;
    wherein the boundary region corresponds to a sub-array of the gate electrode array or the source/drain pair array; for each row of the gate electrodes or each row of the source/drain pairs in the sub-array, the boundary line is formed in a special pattern; the gate electrodes or the source/drain electrode pairs at the boundary region defined by both of the first and second masks are divided into a first portion patterned by the first mask and a second portion patterned by the second mask; the boundary region is divided incrementally or by square wave such that the area of each of the gate electrodes or the source/drain electrode pairs in the first portion increases along the boundary direction and that in the second portion decreases along the boundary direction.

2. The method as claimed in claim 1, wherein the boundary line used for dividing each row of the gate electrodes and each row of the source/drain pairs is a tilted straight line.

3. The method as claimed in claim 1, wherein the boundary line used for dividing each row of the gate electrodes and each row of the source/drain pairs is in a ladder pattern.

4. The method as claimed in claim 1, wherein the boundary line used for dividing each row of the gate electrodes and each row of the source/drain pairs is in a square wave pattern.

5. The method as claimed in claim 1, wherein the boundary line used for dividing each row of the gate electrodes and each row of the source/drain pairs is in an embedded line pattern.

6. The method as claimed in claim 1, wherein the boundary line divides a row of the gate or source/drain electrodes from the first region to the second region, then continues to divide the next row of the gate or source/drain electrodes from the second region to the first region, and so forth.

7. The method as claimed in claim 1, wherein the boundary line divides a row of the gate or source/drain electrodes from the first region to the second region, then goes back to the first region and continues to divide the next row of the gate or source/drain electrodes from the first region to the second region, and so forth.

8. A liquid crystal display, wherein the shot mura phenomenon is minimized, is fabricated with the method as claimed in claim 1.

9. A method for fabricating a liquid crystal display including a plurality of pixels, the method comprising the steps of:
    forming a gate pattern, a gate electrode array, a channel array isolated from the gate electrode array, a source/drain pair array, and a pixel electrode array in a substrate; wherein the gate pattern includes a plurality of separated gate lines connected with the electrode array, and the source and drain in each source/drain pair are spaced from each other, and the pixel electrode array is coupled to the drains of the source/drain pair array;
    and wherein the steps for forming the gate pattern and the source/drain pair array, at least, comprise the steps of:
    forming a photoresist layer;
    dividing the photoresist layer into a first region, a second region, and a boundary region, divided into a first portion and a second portion by a boundary line, between the first region and the second region;
    defining the first region and the first portion with a first mask; and
    defining the second region and the second portion with a second mask;
    wherein the boundary region corresponds to a sub-array of the gate electrode array or the source/drain pair array; for each row of the gate electrodes or each row of the source/drain pairs in the sub-array, the boundary line is formed in a special pattern; the gate electrodes or the source/drain electrode pairs at the boundary region defined by both of the first and second masks are divided into a first portion patterned by the first mask and a second portion patterned by the second mask; the boundary region is divided incrementally or by square wave such that the area of each of the gate electrodes or the source/drain electrode pairs in the first portion increases along the boundary direction and those in the second portion decreases along the boundary direction.

10. The method as claimed in claim 9, wherein the boundary line used for dividing each row of the gate electrodes and each row of the source/drain pairs is a tilted straight line.

11. The method as claimed in claim 9, wherein the boundary line used for dividing each row of the gate electrodes and each row of the source/drain pairs is in a ladder pattern.

12. The method as claimed in claim 9, wherein the boundary line used for dividing each row of the gate electrodes and each row of the source/drain pairs is in a square wave pattern.

13. The method as claimed in claim 9, wherein the boundary line used for dividing each row of the gate electrodes and each row of the source/drain pairs is in an embedded line pattern.

14. The method as claimed in claim 9, wherein the boundary line divides a row of the gate or source/drain electrodes from the first region to the second region, then continues to divide the next row of the gate or source/drain electrodes from the second region to the first region, and so forth.

15. The method as claimed in claim 9, wherein the boundary line divides a row of the gate or source/drain electrodes from the first region to the second region, then goes back to the first region and continues to divide the next row of the gate or source/drain electrodes from the first region to the second region, and so forth.

* * * * *